United States Patent
Ohashi et al.

(10) Patent No.: US 9,536,170 B2
(45) Date of Patent: Jan. 3, 2017

(54) MEASUREMENT METHOD, IMAGE PROCESSING DEVICE, AND CHARGED PARTICLE BEAM APPARATUS

(71) Applicant: Hitachi High-Technologies Corporation, Minato-ku, Tokyo (JP)

(72) Inventors: Takeyoshi Ohashi, Tokyo (JP); Junichi Tanaka, Tokyo (JP); Yutaka Hojo, Tokyo (JP); Hiroyuki Shindo, Tokyo (JP); Hiroki Kawada, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/404,499

(22) PCT Filed: May 27, 2013

(86) PCT No.: PCT/JP2013/064571
§ 371 (c)(1),
(2) Date: Nov. 28, 2014

(87) PCT Pub. No.: WO2013/180043
PCT Pub. Date: Dec. 5, 2013

(65) Prior Publication Data
US 2015/0110406 A1    Apr. 23, 2015

(30) Foreign Application Priority Data

May 31, 2012   (JP) .................................. 2012-123901

(51) Int. Cl.
*G06K 9/46*       (2006.01)
*H01J 37/22*      (2006.01)
*H01J 37/28*      (2006.01)

(52) U.S. Cl.
CPC ........... *G06K 9/4604* (2013.01); *G06K 9/4638* (2013.01); *H01J 37/222* (2013.01); *H01J 37/28* (2013.01);
(Continued)

(58) Field of Classification Search
CPC .... H01J 2237/2817; H01J 37/28; H01J 37/26; H01J 37/3026; G06K 9/4604; G06K 9/50; G06K 9/4609; G06K 9/6204; G06K 9/4638; G06K 9/4633; G06T 7/0083; G06T 7/0085; G06T 7/0046; G06T 7/0089; G06T 9/20; G01B 15/00; G01B 11/24; G01B 15/04; H04N 1/4092
See application file for complete search history.

(56) References Cited

U.S. PATENT DOCUMENTS 7,145,156 B2   12/2006  Abe
7,732,792 B2    6/2010  Matsuoka et al.
(Continued)

FOREIGN PATENT DOCUMENTS

JP   2005-228560 A   8/2005
JP   2006-029891 A   2/2006
JP   2009-043937 A   2/2009

*Primary Examiner* — Kim Vu
*Assistant Examiner* — Michael Vanchy, Jr.
(74) *Attorney, Agent, or Firm* — Miles & Stockbridge P.C.

(57) ABSTRACT

An error of an outline point due to a brightness fluctuation cannot be corrected by a simple method such as a method of adding a certain amount of offset. However, in recent years as the miniaturization of the pattern represented by a resist pattern has progressed, it has been difficult to appropriately determine a region that serves as a reference. An outline of the resist pattern is extracted from an image of the resist pattern obtained by a charged particle beam apparatus in consideration of influence of the brightness fluctuation. That (Continued)

is, a plurality of brightness profiles in the vicinity of edge points configuring the outline are obtained and an evaluation value of a shape of the brightness profile in the vicinity of a specific edge is obtained based on the plurality of brightness profiles, and the outline of a specific edge point is corrected, based on the evaluation value.

20 Claims, 15 Drawing Sheets

(52) U.S. Cl.
CPC .. *G06K 2209/19* (2013.01); *H01J 2237/24592* (2013.01); *H01J 2237/2817* (2013.01)

(56) References Cited

U.S. PATENT DOCUMENTS

| | | | | |
|---|---|---|---|---|
| 2004/0081350 | A1* | 4/2004 | Kitamura | G06K 9/00 382/149 |
| 2005/0280849 | A1* | 12/2005 | Kojima | H04N 1/4074 358/1.9 |
| 2006/0215161 | A1* | 9/2006 | Den Boef | G03F 9/7088 356/401 |
| 2008/0240494 | A1* | 10/2008 | Oosawa | G06F 17/30259 382/100 |
| 2010/0166283 | A1* | 7/2010 | Grosskopf | A61B 6/466 382/131 |

* cited by examiner

- SEM IMAGE IS INPUT — S1001
- OUTLINE IS EXTRACTED — S1002
- BRIGHTNESS PROFILE IS OBTAINED — S1003
- EVALUATION VALUE OF SPECIFICITY IS CALCULATED — S1004
- DEFECT EDGE POINT IS DETERMINED — S1005
- STERIC HINDRANCE IS CORRECTED — S1006
- CORRECTED OUTLINE IS EXTRACTED — S1007

| ACCELER-ATION VOLTAGE | PROBE CURRENT | MAGNIFI-CATION | FRAME INTEGRATION | SCAN SPEED | SCAN ORDER | MATERIAL | RELIABILITY INDEX |
|---|---|---|---|---|---|---|---|
| 500 | 4 | 200000 | 16 | 1 | TV | RESIST | 0.95 |
| 300 | 12 | 200000 | 8 | 1 | TV | RESIST | 0.42 |
| 500 | 8 | 100000 | 16 | 1 | TV | SiO2 | 0.66 |

FIG. 17

| | | | | |
|---|---|---|---|---|
| ACCELERATION VOLTAGE | ○ AUTOMATIC | ● DESIGNATION | 800 | V |
| PROBE CURRENT | ○ AUTOMATIC | ● DESIGNATION | 10 | pA |
| MAGNIFICATION | ○ AUTOMATIC | ● DESIGNATION | 200000 | TIMES |
| FRAME INTEGRATION | ○ AUTOMATIC | ● DESIGNATION | 8 | TIMES |
| SCAN SPEED | ● AUTOMATIC | ○ DESIGNATION | | TIMES |
| SCAN ORDER | ● AUTOMATIC | ○ DESIGNATION | | |
| SCAN ORDER | ○ UNKNOWN | ● DESIGNATION | RESIST | |

CONDITIONS INPUT

MEASUREMENT METHOD, IMAGE PROCESSING DEVICE, AND CHARGED PARTICLE BEAM APPARATUS

TECHNICAL FIELD

The present invention relates to a shape measurement of a fine pattern.

BACKGROUND ART

A lithography technique with an ArF excimer laser as a light source is used for forming a fine pattern in a semiconductor manufacturing process. With the miniaturization of the pattern, the lithography is performed in the vicinity of a resolution limit in which the fine pattern of a size of a fraction of a wavelength of the ArF excimer laser is formed. An Optical Proximity Correction (OPC) technique for correcting a mask pattern shape or an exposure light source shape is essential for the lithography which is in the vicinity of the resolution limit in consideration of a proximity effect of the light. For optimization of the correction, it is necessary to measure a fine resist sample actually prepared by transferring a mask pattern and, to evaluate a deviation from a design, and to correct the mask or the light source shape.

For measurement of an outline of a pattern shape of the fine resist sample, a scanning electron microscope (SEM) is used. Brightness in an edge portion of the pattern is strong in a SEM image of a sample obtained by using the SEM. The portion in which the brightness is strong is referred to as a white band and it is possible to measure the outline of the pattern shape of the sample by extracting the white band as a line segment. Furthermore, it is possible to extract the outline with high accuracy by determining a point (edge point) configuring the outline based on a brightness profile in the vicinity of the white band.

However, the outline extracted from the SEM image by such a method is affected by contraction (shrinking) of the resist or charging of a resist surface by electron beam irradiation when observing the SEM. As a method to deal with such a problem, a method for correcting fluctuation of a SEM bias due to the charging by replacing the brightness profile of a correction target region is disclosed in PTL 1.

Furthermore, there is a problem that the outline is lost when extracting the white band as the line segment in the SEM image in which noise is strong or a large error occurs in a position of the edge point in the image in which contrast of the white band is weak. As a method to deal with such a problem, a method for appropriately connecting a lost portion of the outline is disclosed in PTL 2 and a method for increasing the reliability of the outline by configuring the outline excluding the edge point if a degree of separation of the brightness is small in the brightness profile in the vicinity of the edge point is disclosed in PTL 3.

CITATION LIST

Patent Literature

[PTL 1] JP-A-2005-228560
[PTL 2] JP-A-2009-43937
[PTL 3] JP-A-2006-29891

SUMMARY OF INVENTION

Technical Problem

The SEM image is obtained by imaging an amount of signal electrons emitted from the sample by irradiating the electron beam as the brightness. That is, in theory, the image brightness is proportional to the amount of the signal electrons. However, a part of the signal electrons is taken into the sample again by charging of a sample surface, the signal electrons are affected by a steric hindrance with which the signal electrons are shielded by a high side wall of a pattern in the vicinity thereof, or the signal electrons are not taken into a detector and are not detected depending on an orbit of the signal electrons, and as a result, the brightness fluctuates. Furthermore, in a circuit for converting an amount of the signal electrons taken into the detector into image brightness, it may be non-linear conversion. For example, when the amount of the signal becomes a certain value or more, the amount of the signal electrons is output as the maximum value of the brightness regardless of the amount of the signal. The image brightness may not be proportional to the amount of the signal electrons for such reasons.

Then, if the image brightness is not proportional to the amount of the signal electrons by occurrence of the fluctuation of the image brightness, an error occurs in an outline point that is determined based on the brightness profile. The charging or shielding effect of a neighboring pattern varies according to the pattern shape and a detection efficiency of the detector depends on a position within a field of vision of the SEM. Thus, the error of the outline point due to the brightness fluctuation cannot be corrected by a simple method such as a method of adding a certain amount of offset.

In the method described in PTL 3, if the degree of separation of the brightness is decreased by the brightness fluctuation, the edge point can be excluded, but if the degree of separation of the brightness is not significantly decreased, excluding of the edge point is not effective and the position of the edge point cannot be corrected.

Furthermore, in the method described in PTL 1, the brightness fluctuation is corrected by replacing the brightness profile of a target region with the brightness profile of a reference region, it is necessary to set a surface region (reference region) on the sample in which a difference of an amount of secondary electrons is relatively small in one place and it is necessary to predetermine a reference profile obtained in the reference region. However, in recent years as the miniaturization of the pattern has progressed, it has been difficult to appropriately determine a region that serves as the reference as described above. For example, when using such a method, the reference region that can be considered appropriate from experience by a measuring person observing the image should be designated. In such a case, a problem that damage is increased due to time or beam irradiation by expanding an observation target to a region other than the measuring target may occur.

Therefore, a method in which the error of the edge point due to the brightness fluctuation is detected, the edge point in which the error is great is removed, and the position of the edge point is corrected is required without the need to predetermine the reference region.

Solution to Problem

A typical example among the inventions disclosed in the present application is as follows. That is, proposed is a measurement method measuring an outline of a pattern from an image of a sample including the pattern obtained by a charged particle beam apparatus, including: a first step of extracting edge points configuring the outline of the pattern; a second step of obtaining a first brightness profile in the vicinity of a first edge point among the edge points; a third step of obtaining a second brightness profile in the vicinity of a second edge point among the edge points; a fourth step of obtaining a third brightness profile in the vicinity of a third edge point among the edge points; a fifth step of obtaining an evaluation value of a shape of the first brightness profile, based on the first brightness profile and the second and third brightness profiles that are obtained; and a sixth step of performing an outline correction of the pattern of the first edge point based on the evaluation value.

Furthermore, as other examples, there is proposed an image processing device and a charged particle beam apparatus. The image processing device that measures an outline of a pattern from an image of a sample including the pattern obtained by the charged particle beam apparatus includes a brightness profile obtaining section that obtains a plurality of brightness profiles in the vicinity of edge points configuring the outline; a shape evaluation section that extracts an evaluation value of a shape of a first brightness profile, based on the plurality of brightness profiles; and an outline correction section that corrects the outline of the edge points of the first brightness profile, based on the evaluation value.

Advantageous Effects of Invention

It is possible to accurately obtain the outline of the pattern of the sample by using the invention.

BRIEF DESCRIPTION OF DRAWINGS

FIG. 17 is a view illustrating one example of GUI for displaying or inputting image obtaining conditions.

DESCRIPTION OF EMBODIMENTS

As an embodiment to solve the problems described above, an image processing method extracting an outline of a resist pattern from a SEM image of the resist pattern obtained by a scanning electron microscope (SEM) in consideration of influence of brightness fluctuation will be described.

First, a method for extracting the outline of the resist pattern from the SEM image is described. The pattern is a portion of a concave shape formed on a surface of a sample and signal electrons emitted from the sample when irradiating electron beams are increased in an outline section (edge section) of the pattern. Thus, a portion (white band) in which the brightness is strong corresponding to the outline is observed in the SEM image expressed as an image brightness by detecting the signal electrons.

Figure 1A:
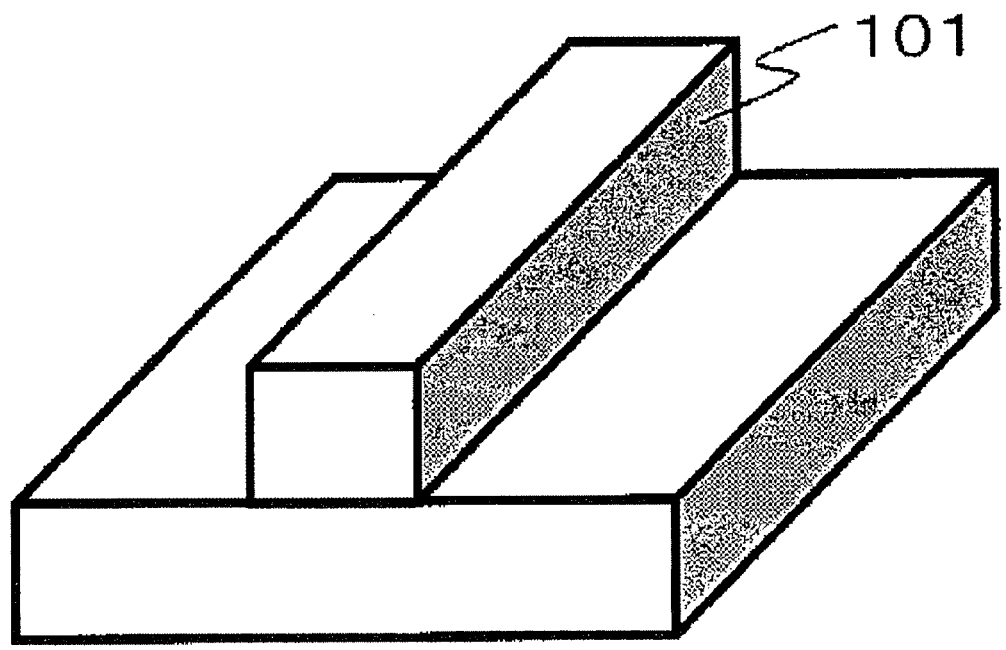
FIG. 1A is a schematic view of a sample having a pattern of a line shape.
Figure 1B:
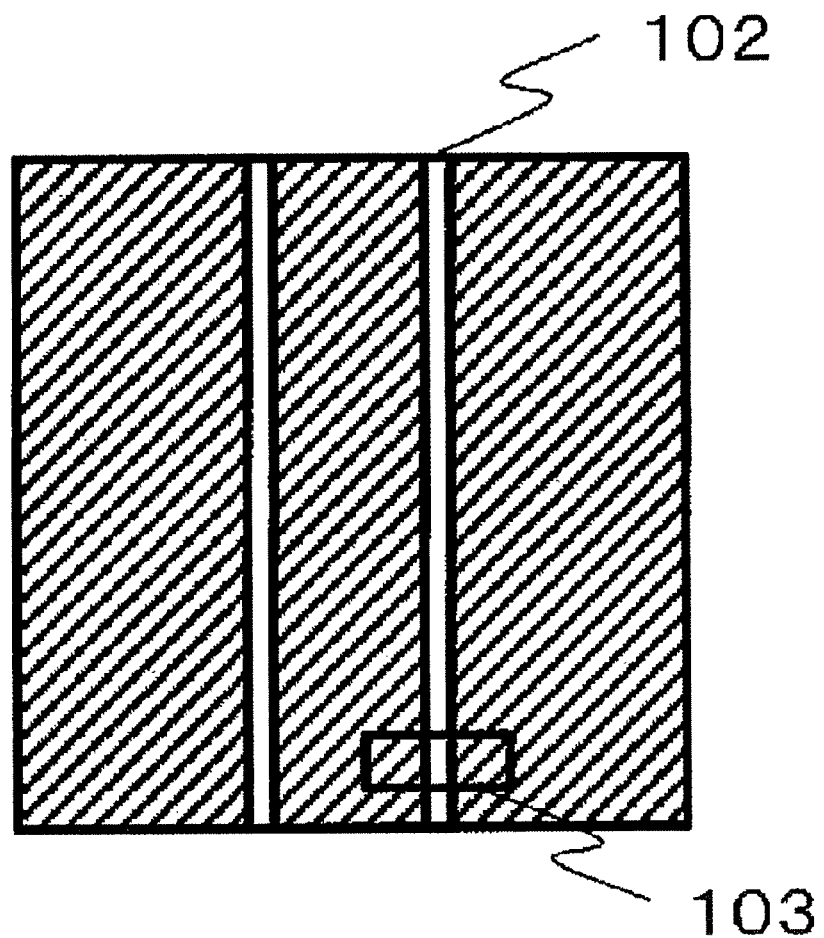
FIG. 1B is a schematic view of a SEM image of a line pattern.

FIG. 1A is a schematic view of the sample having a pattern (line pattern) 101 of a line shape and FIG. 1B is a schematic view of the SEM image of the line pattern. A white band 102 corresponding to the outline of the line pattern can be observed.

For extracting the outline from the SEM image, a position of the white band is detected by an imaging process as edge points and a line segment provided by connecting the edge points may be obtained. As the image processing method, an arbitrary method may be used as long as the method detects a bright portion as the line segment. For example, only pixels having the brightness greater than a certain value are extracted and a miniaturizing process is performed so that a width of a region of the pixels is one pixel, and a center of remaining pixels is determined as the edge points, and thereby the outline is obtained by connecting the edge points.

Furthermore, there is also a method for extracting the outline by using a brightness profile in the vicinity of the white band in addition to the method using the imaging process described above. Here, the brightness profile is a profile of the image brightness in a direction intersecting a direction of the white band, that is, is a profile of a brightness distribution in a region 103 in the vicinity of the white band. Moreover, in the following description, a case where the brightness profile in a direction orthogonal to the direction of the white band is obtained is exemplified, but the direction may not be the direction orthogonal to the direction of the white band necessarily. For example, if a magnification in a vertical direction and a magnification in a horizontal direction of the image are different, the direction orthogonal to the direction of the white band in the SEM image may not be a direction orthogonal to the outline corresponding to the white band on the sample. In such a case, an angle between the direction of the white band and a direction in which the brightness profile is obtained may be set corresponding to the magnification in the vertical direction and the magnification in the horizontal direction of the image so as to be the direction orthogonal to the outline on the sample. Furthermore, if a projection structure and the like appear in the white band due to local noise, the direction of the original outline and the direction of a local white band may be different. In such a case, design data of the pattern is referred to and the direction of the outline corresponding to the white band is determined, and then a direction orthogonal to the direction of the outline may be the direction to obtain the brightness profile.

In order to reduce the noise of the profile when obtaining the brightness profile, the brightness that is obtained by being averaged in the direction of the white band may be also used. That is, the region 103 is set in a range in which the width in the direction of the white band is greater than one pixel and an averaged profile may be obtained in the range. Presence or absence of averaging, a size of the region, or the like is designated in advance. Furthermore, in a case where an outer periphery (side) of the region 103 does not match a grid of the pixel if a direction of a vertical axis or a direction of a horizontal axis of the SEM image does not match the direction (the direction orthogonal to the white band) to obtain the brightness profile, and the like, an imaging process in which the image is rotated, an imaging process in which the number of pixels is increased, or the like is applied, and the outer periphery of the region 103 exactly matches a boundary of the pixel and thereby the brightness profile can be obtained.

Figure 2:
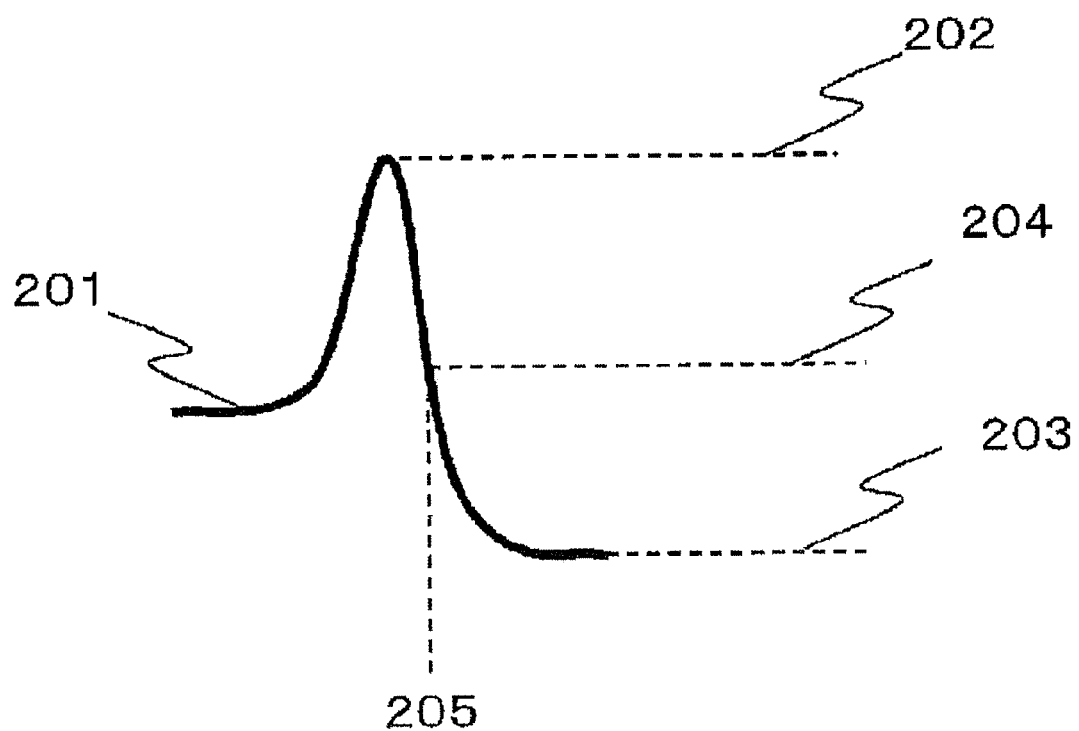
FIG. 2 is a schematic view of a brightness profile.

FIG. 2 is a schematic view of the brightness profile. A peak of a brightness profile 201 corresponds to the white band. A position of the brightness peak may simply be the edge point, but in this case, the position of the outline is likely to receive influence of the brightness due to the noise of the brightness. As a method for determining the edge points in which the noise is strong, there is a threshold method using the brightness profile. In the threshold method, a reference brightness C (204) is obtained by Expression 1 using a maximum value A (202) of the brightness inside the profile and a minimum value B (203) of the brightness that is on the outside of the pattern more than the place (the position of the peak) of the maximum value.

$$C=B+(A-B)T$$ [Expression 1]

Here, T is a value of a range from 0 to 1 that is predetermined, and 0.5 is often used. Thereafter, a position 205 that is the reference brightness C is determined as the edge point in the brightness profile between the maximum value and the minimum value. Moreover, which side the outside of the pattern more than the position of the peak becomes is determined by another method such as a method referring to the design data of the pattern. The method described above is applied to each point on the white band and the obtained edge points are connected thereby obtaining the outline. Intervals on the points on the white band to be applied may be arbitrary.

Furthermore, when connecting the edge points, each edge point may be connected by a straight line and may be connected by performing interpolation such as spline interpolation in an arbitrary method.

Embodiment 1

One example of an embodiment for extracting the outline of the pattern in consideration of the brightness fluctuation will be described. The embodiment is a method in which the edge points influenced by the brightness fluctuation are detected and the outline is configured by removing the edge points.

Figure 3:
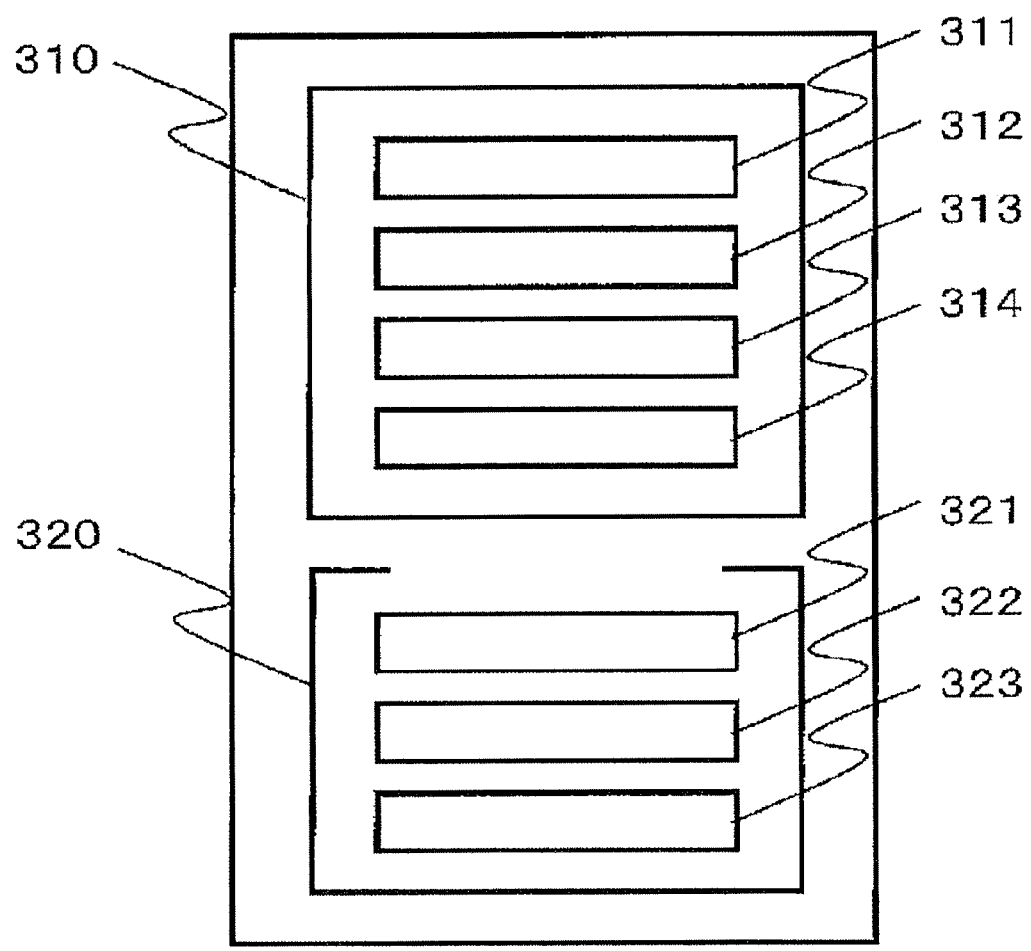
FIG. 3 is an entire view of a schematic configuration of an image processing device according to an embodiment.

FIG. 3 is an entire view of a schematic configuration of the image processing device according to the embodiment and the image processing device is configured of a recording device 310 and a calculation device 320. The recording device 310 is provided with an image recording section 311, an outline recording section 312, a brightness profile recording section 313, and an evaluation value recording section 314. The calculation device 320 is provided with an image processing calculation section 321, a brightness profile evaluation calculation section 322, and an outline correction calculation section 323. The above configuration may be realized by configuring as a separate device respectively, or may be realized in one calculator or a plurality of calculators.

Figure 4:
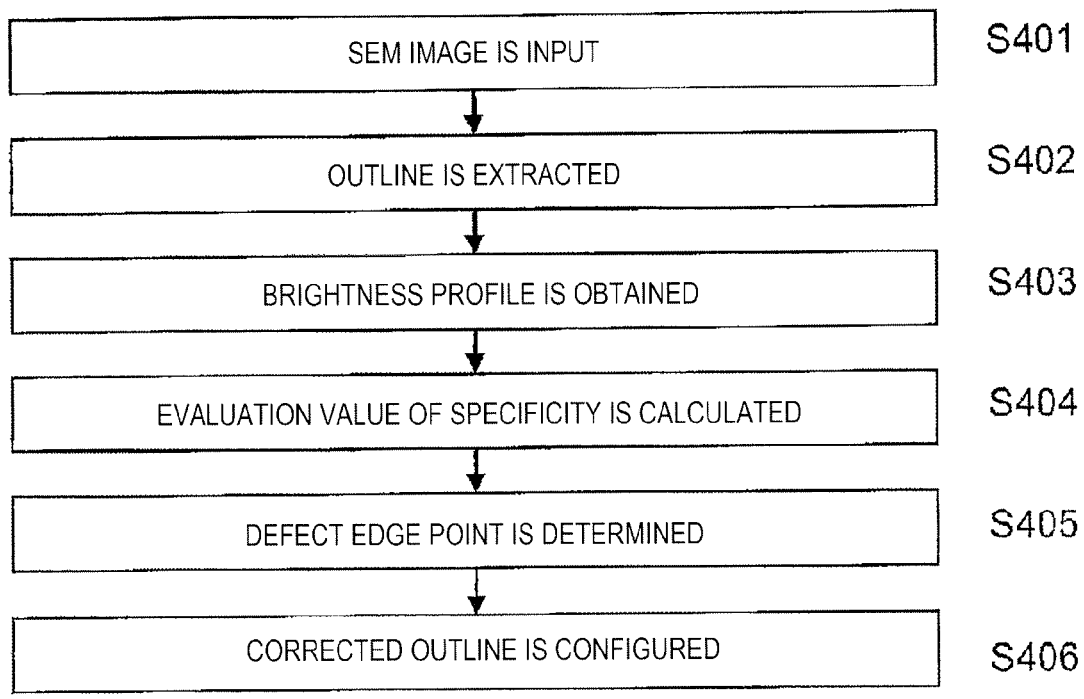
FIG. 4 is a view illustrating one example of a flowchart according to the embodiment.

FIG. 4 is one example of a flowchart according to the embodiment. Hereinafter, the flowchart will be described.

In step S401, a SEM image file obtained by photographing a resist sample that is measured is input and is stored in the image recording section 311.

In step S402, the image processing calculation section 321 is used and calculation is performed with respect to SEM image data stored in the SEM image recording section 311, and an outline of a sample pattern is extracted. An example of the outline is schematically indicated in a reference numeral 501 of FIG. 5. The extracted outline data is stored in the outline recording section 312. Here, the outline data is an aggregation of coordinates of the edge points configuring the outline. For the extraction of the edge points, an arbitrary method may be used, but, for example, as described above, the position of the white band in which the brightness is strong in the image may be the edge point and the edge point may be determined by applying the threshold method.

In step S403, the calculation is performed with respect to the SEM image stored in the SEM image recording section 311 using the image processing calculation section 321 and the brightness profile of the periphery of the edge point is calculated with respect to the edge points stored in the outline recording section 312. An example of the brightness profile is schematically indicated in a reference numeral 502 of FIG. 5. The calculated brightness profile is stored in the brightness profile recording section 313. At this time, combined information indicating a correspondence between each brightness profile and each edge point is stored. Moreover, the brightness profile that is obtained by applying a smoothing process for reducing the noise to the brightness profile may be stored. In addition, in step S402, if a process in which the brightness profile is calculated is included in such a case where the threshold method is used and the like, step S403 is omitted and the brightness profile calculated in step S402 may be stored in the brightness profile recording section 313.

In step S404, specificity of a shape is evaluated by using the brightness profile evaluation calculation section 322 for the brightness profile stored in the brightness profile recording section 313 and an obtained evaluation value of the specificity is stored in the evaluation value recording section 314. An example of the evaluation value of the specificity is schematically indicated in a reference numeral 503 of FIG. 5.

An example of the evaluation method of the specificity is described below. Moreover, the evaluation value of the specificity stored in the evaluation value recording section 314 may be one value for each brightness profile or may be a plurality of values obtained by a plurality of methods.

One example is an evaluation method in which the maximum value of the brightness is extracted for each brightness profile and a deviation from an average value of the maximum value is the evaluation value. Here, the deviation may simply be a difference or may be a square or an absolute value of the difference. Otherwise, a deviation value is obtained and a difference (or the square or the absolute value of the difference) from 50 may be the evaluation value. In addition, an arbitrary statistical index indicating how much a certain value is deviated from an average of the aggregation including the value may be used. Moreover, the minimum value of the brightness may be used instead of the maximum value of the brightness, or a value calculated from a value such as a difference or an average between the maximum value and the minimum value of the brightness may be used.

Furthermore, another example is a method using a plurality of values among the values (the maximum value or the minimum value of the brightness, and values calculated from those values) described in the above examples of the evaluation method. Simply, the evaluation value is calculated for each value by the example of the evaluation method described above and the average, a square sum average, the maximum value thereof, or the like may be the evaluation value of the specificity of the brightness profile. Otherwise, vectors in which the values (the maximum value or the minimum value of the brightness, and values calculated from those values) used for the evaluation are elements created for each brightness profile and an average vector of those vectors is obtained, and, for example, similarity between each vector and the average vector is obtained by a normalization correlation coefficient and the like, and thereby the similarity may be the evaluation value of the specificity.

Furthermore, another example is a method for evaluating the specificity of the shape of the brightness profile. In the following description, an example of a case where the specificity is evaluated by the normalization correlation coefficient is described. A certain brightness profile is represented by a function P(i). That is, the brightness is P(1), P(2), P(3) . . . from an end of the profile. Furthermore, the brightness profile that is obtained by averaging all brightness profiles is represented by a function Q(i). The specificity of the brightness profile represented by the function P(i) can be evaluated by a normalization correlation coefficient R of P(i) and Q(i). A calculation method of R is as shown in the following Expression 2.

$$P_0 = \frac{1}{N}\sum_{i=1}^{N} P(i), Q_0 = \frac{1}{N}\sum_{i=1}^{N} Q(i)$$

$$P_n(i) = \frac{P(i) - P_0}{\sqrt{\sum_{i=1}^{N} (P(i) - P_0)^2}},$$

$$Q_n(i) = \frac{Q(i) - Q_0}{\sqrt{\sum_{i=1}^{N} (Q(i) - Q_0)^2}}$$

$$R = \sum_{i=1}^{N} P_n(i) Q_n(i)$$

[Expression 2]

Here, N is the number of brightness data configuring the profile, P0 and Q0 are respectively the average brightnesses of P(i) and Q(i), and Pn(i) and Qn(i) are functions obtained by normalizing P(i) and Q(i) respectively. The coefficient R takes a value from −1 to 1 and, as the value is small, the deviation from the average brightness profile is increased, that is, the specificity is increased. So far, the evaluation method using the normalization correlation is described in detail, but the statistical index indicating the similarity with the average brightness profile may be used in addition thereto. For example, a difference between the maximum value of the normalized function Pn(i) and the maximum value of Qn(i), or a difference between the minimum values thereof may be used.

Furthermore, a profile that is obtained by a statistical method for obtaining a standard profile from all brightness profiles may be used instead of the average brightness profile Q(i). For example, after obtaining the averaged profile from all brightness profiles, the normalization correlation coefficient R of the averaged profile is obtained, the brightness profile in which the normalization correlation coefficient R is the minimum value or the brightness profile in which the normalization correlation coefficient R is a predetermined value or less is determined to be abnormal, and the brightness profiles are omitted, and then an average of remaining profiles may be used. Furthermore, the process may be repeated until the normalization correlation coefficient R of all brightness profiles taking the average is a predetermined value or greater.

In step S405, for each edge point stored in the outline recording section 312, it is determined whether or not the evaluation value stored in the evaluation value recording section 314 is in a predetermined allowable range by using the outline correction calculation section 323. If the evaluation value is not in the allowable range, it is regarded as a defective edge point and information indicating the defect is added to the outline recording section 312.

In step S406, a new outline is configured of the edge points other than the edge point that is determined as the defective edge point in step S405 among the edge points stored in the outline recording section 312 by using the outline correction calculation section 323, and the new outline is stored in the outline recording section 312. An example of the newly configured outline is schematically indicated in a reference numeral 504 of FIG. 5.

It is possible to remove the edge point in which an error occurs due to the brightness fluctuation by using the method described above when extracting the outline of the pattern from the SEM image and it is possible to obtain the outline having high reliability. Furthermore, it is also possible to indicate the reliability of the outline line to a user by outputting the outline before correction together with the evaluation value of the specificity of the edge point.

Furthermore, a unit 505 may be provided for displaying that the edge point that is determined to be defective is the target to be corrected in step S405 or the newly configured outline is obtained by a result of the correction by separating from or superimposing the output of the SEM image. Thus, the user can recognize the portion of the target to be corrected. Furthermore, the user may further have a unit 506 for inputting whether or not the final correction is performed from a display result of the output of the SEM image. Thus, it is possible to improve accuracy of the correction.

Figure 5:
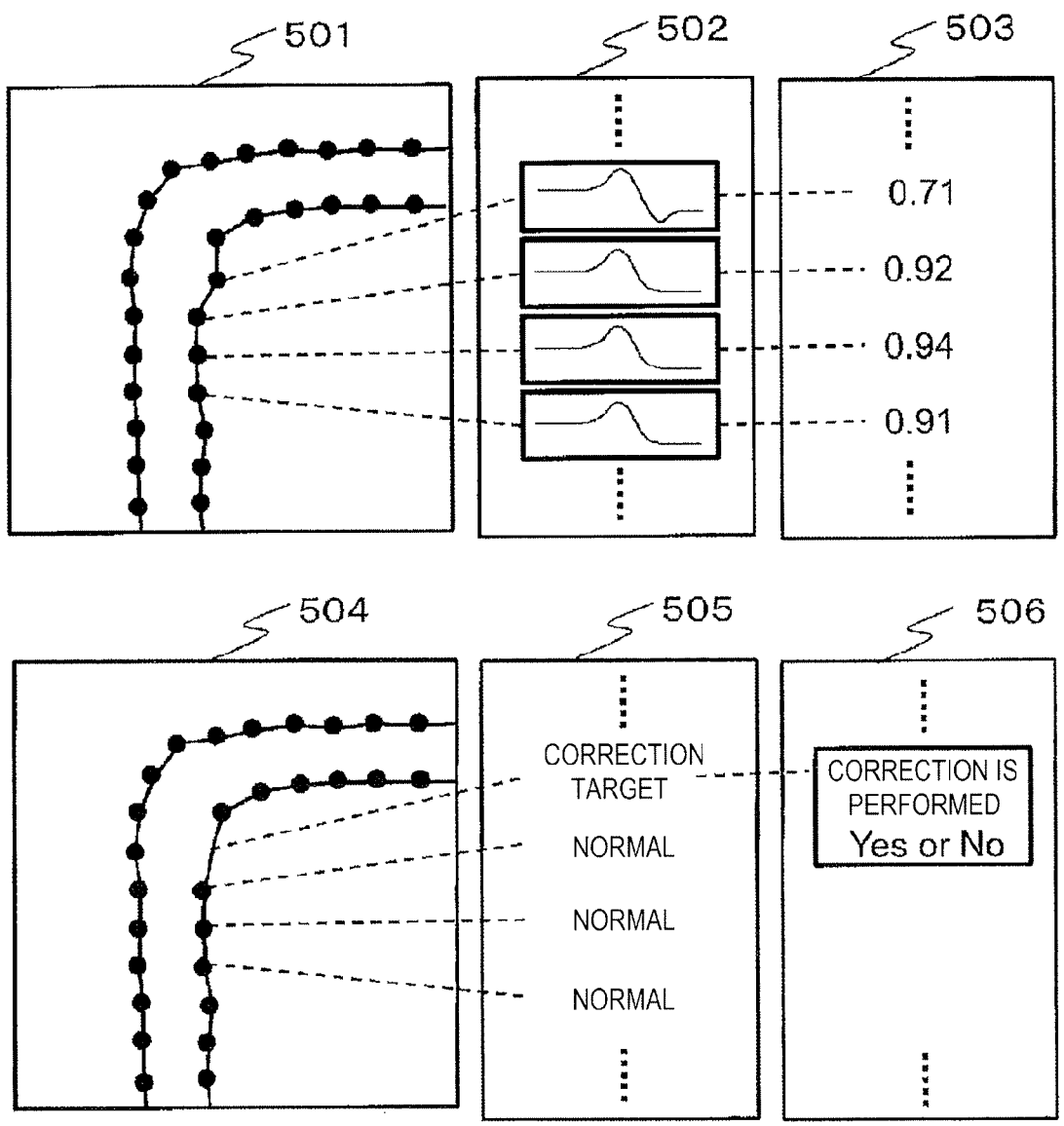
FIG. 5 is a view illustrating an example of an evaluation value of specificity according to the embodiment.

The corrected outline obtained by the method may be output to a storage medium or another device as the data of the edge points or may be displayed as the outline line as the reference numeral 504 of FIG. 5 by using a display device that is not illustrated in FIG. 3. This is also the same as embodiments hereinafter.

Embodiment 2

Another embodiment according to the invention is a method in which an edge point influenced by brightness fluctuation is detected and an outline is configured by correcting the edge point. A schematic view of an entire configuration of an image processing device of the embodiment is similar to FIG. 3.

Figure 6:
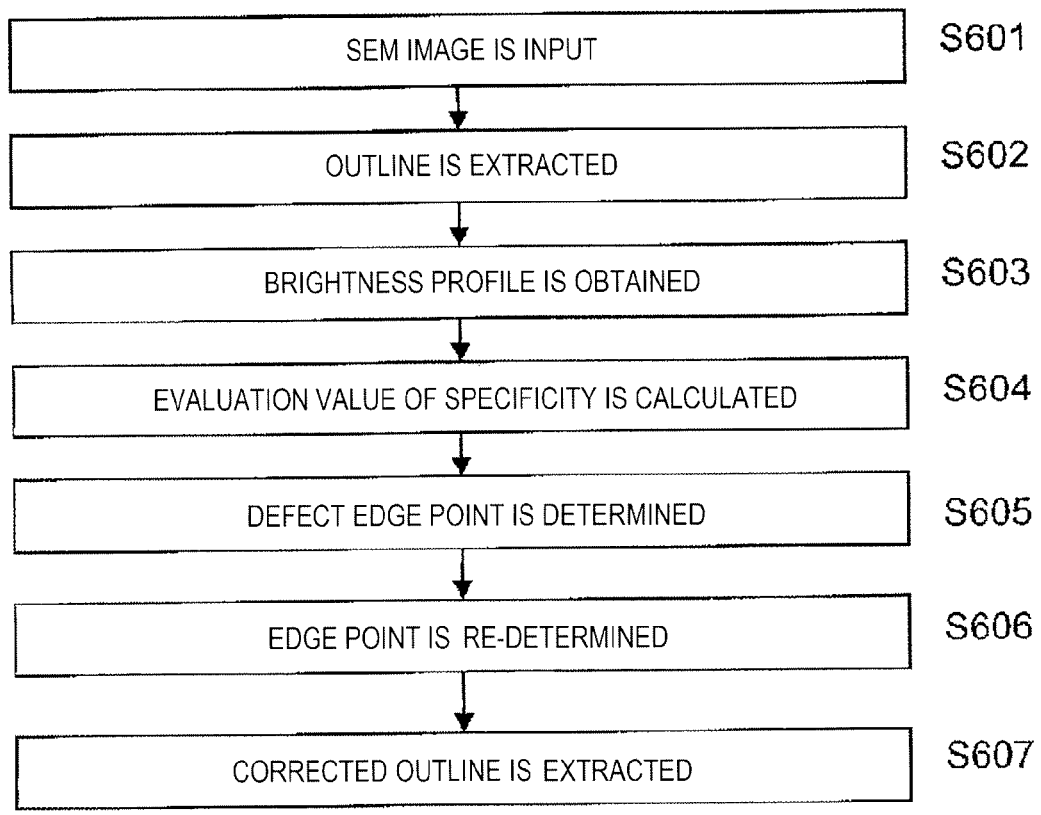
FIG. 6 is a view illustrating one example of a flowchart according to the embodiment.

FIG. 6 is one example of a flowchart according to the embodiment. Hereinafter, the flowchart will be described.

Moreover, a process from step S601 to step S605 is similar to the process from step S401 to step S405 of FIG. 4.

In step S606, for the edge point that is determined to be defective in step S605, the edge point is re-determined from the brightness profile stored in the brightness profile recording section 313 by using the image processing calculation section 321. At this time, the correction is performed by using a comparison result of the brightness profile with the average brightness profile. Moreover, the re-determination of the edge point may be performed with respect to all edge points without performing the defect determination of step S605.

As one example of a specific method of the re-determination of the edge, a case of using the threshold method is described below. The example is one example of a method for correcting a local decrease in the brightness. First, a difference M1 (value obtained by subtracting the minimum value of the normalized average brightness profile Qn(i) from the minimum value of the normalized brightness profile Pn(i)) between the minimum values of the normalized profiles is obtained.

Figure 7:
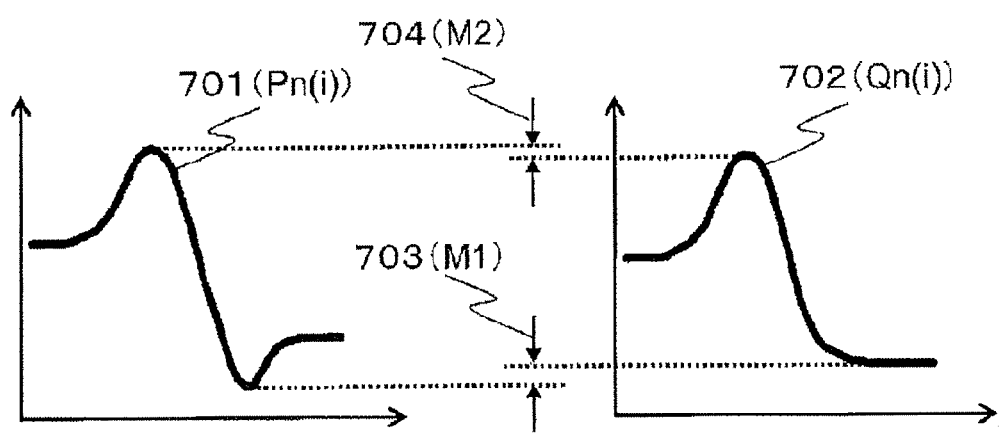
FIG. 7 is a view illustrating one example of a re-determining method of an edge using a threshold method.

FIG. 7 is a view schematically illustrating the values. A reference numeral 701 is the profile Pn(i), a reference numeral 702 is the profile Qn(i), and a reference numeral 703 is the difference M1 between the minimum values. Then, in order to determine the edge point from the brightness profile, the threshold method is used with respect to the normalized brightness profile Pn(i). Here, the correction is performed on the reference brightness. If the correction is not performed, a reference brightness C is calculated by Expression 1, but a reference brightness C' is used that is calculated by performing the correction using a symbol M as shown in the following Expression 3.

$$C'=(B-M_1)+[A-(B-M_1)]T \qquad \text{[Expression 3]}$$

That is, the method determines the reference brightness when applying the threshold method with respect to the normalized brightness profile Pn(i) by using the minimum value in the normalized average brightness profile Qn(i). Moreover, here, the method using the difference between the minimum values of the normalized profiles is described, but a method using a difference M2 (reference numeral 704 of FIG. 7) between the maximum values of the normalized profiles or a method using both thereof may be provided. In this case, the reference brightness C' is calculated by the following Expression 4 and Expression 5.

$$C'=B+[(A-M_2)-B]T \qquad \text{[Expression 4]}$$

$$C'=(B-M_1)+[(A-M_2)-(B-M_1)]T \qquad \text{[Expression 5]}$$

Furthermore, one example of another edge re-determination method is described below. The example is one example of the method for correcting influence of a local brightness gradient in the SEM image. First, the normalized brightness profile Pn(i) and the normalized average brightness profile Qn(i) are obtained. Next, a difference Pn(i)-Qn(i) thereof is obtained and the difference is primarily approximated. Since a slope of an approximate straight line corresponds to the brightness gradient, the brightness profile in which the influence of the brightness gradient is corrected is obtained by subtracting a primarily approximated result from Pn(i). It is possible to determine the edge point by applying the threshold method with respect to the obtained brightness profile.

In addition, a method for directly correcting the position of the edge point may be provided in which the position of the edge point is moved by a value obtained by multiplying a predetermined coefficient by the difference M1 (otherwise, the difference M2 between the maximum values, or M2−M1) of the minimum values of the normalized profile, and the like. Moreover, the reverse number of the gradient in the edge points of the normalized averaged profile may be used instead of using the predetermined coefficient.

Furthermore, the brightness profile Pn(i) is replaced with the average brightness profile Qn(i) and the edge point may be re-determined by using the brightness profile.

Furthermore, here, the method using the normalized brightness profile is described, but the same method may be performed by using the brightness profile before being normalized.

Figure 8:
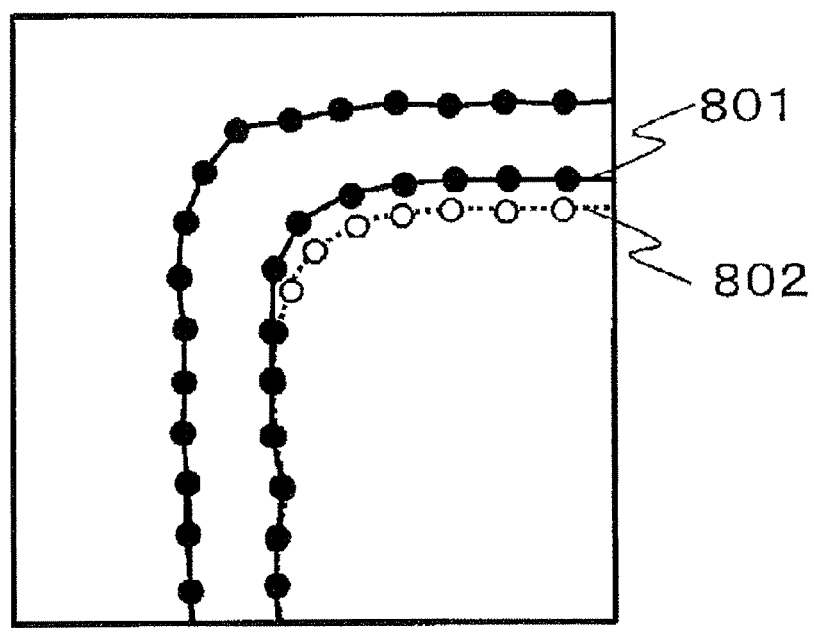
FIG. 8 is a view illustrating an example of an outline before a correction and an outline after the correction.

In step S607, the outline is configured of the edge point that is determined in step S606 and the outline is stored in the outline recording section 312. Examples of the outline before the correction and the outline after the correction are schematically indicated as reference numerals 801 and 802 of FIG. 8 respectively.

It is possible to correct the error of the edge point due to the brightness fluctuation and it is possible to obtain the outline having high accuracy by using the method described above when extracting the outline of the pattern from the SEM image.

Embodiment 3

Another embodiment according to the invention is a method in which the edge point receiving the influence due to the brightness fluctuation due to the steric hindrance is detected and the outline is configured by correcting the edge point.

Figure 9:
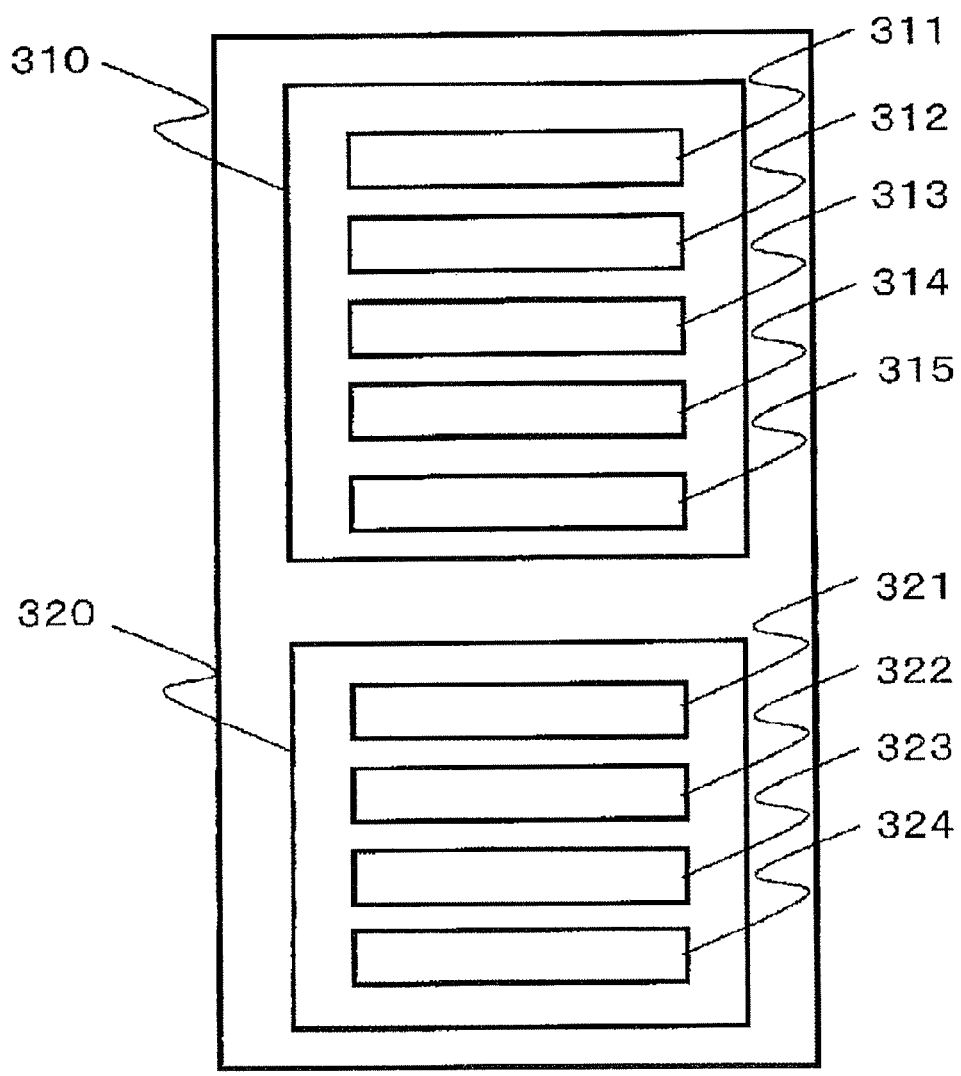
FIG. 9 is an entire view of a schematic configuration of an image processing device according to the embodiment.

A schematic view of an entire configuration of the image processing device according to the embodiment is illustrated in FIG. 9. A pattern cross-section recording section 315 is provided in the recording device 310 and a steric hindrance calculation section 324 is provided in the calculation device 320 in addition to the configuration illustrated in FIG. 3.

Figure 10:
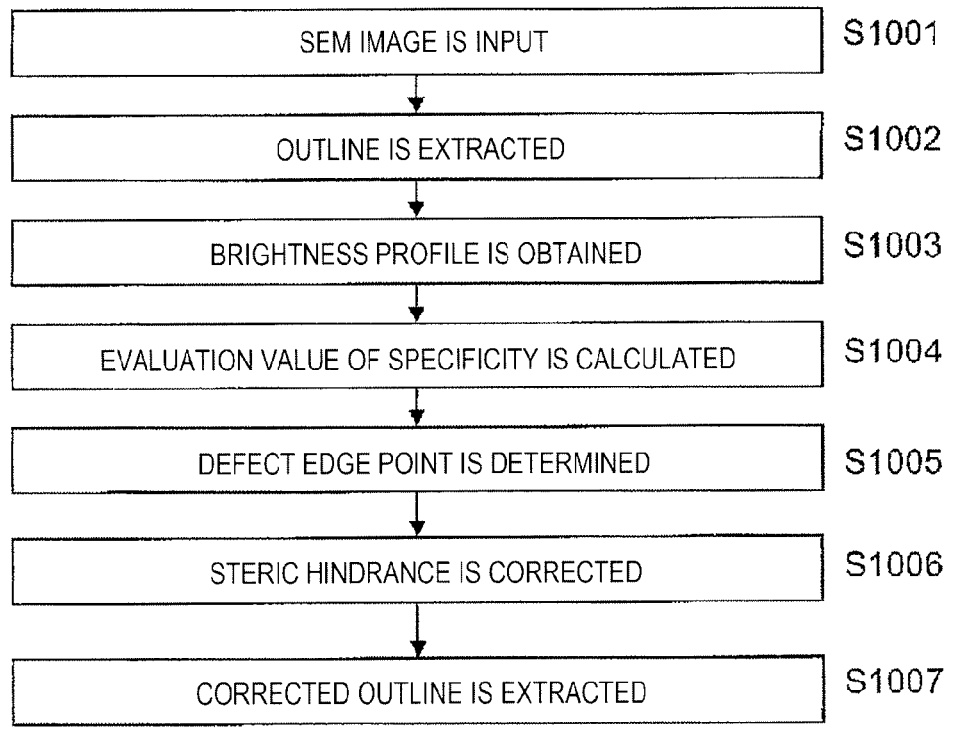
FIG. 10 is a view illustrating one example of a flowchart according to the embodiment.

FIG. 10 is one example of a flowchart according to the embodiment. Hereinafter, the flowchart is described.

A process from step S1001 to step S1005 is similar to the process from step S401 to step S405 of FIG. 4.

In step S606, the edge point is re-determined by using the image processing calculation section 321 after the correction is performed with respect to the brightness profile of the edge point that is determined to be defective in step S605 by using the steric hindrance correction section 324. For the detection of the edge point, a known method such as the threshold method obtaining the edge point from the brightness profile may be used.

Next, one example of the method for correcting the influence of the steric hindrance is described.

Figure 11A:
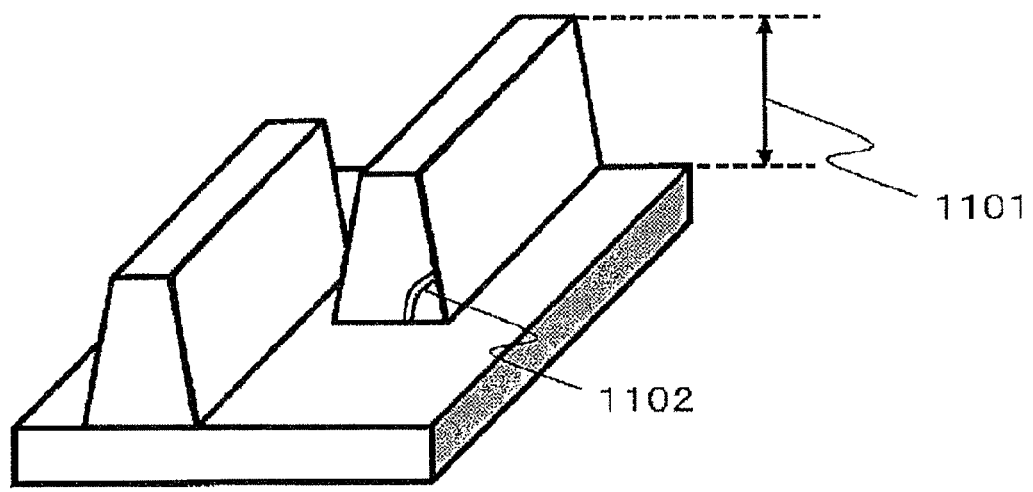
FIG. 11A is a schematic view of a pattern structure in which brightness decrease occurs due to steric hindrance.
Figure 11B:
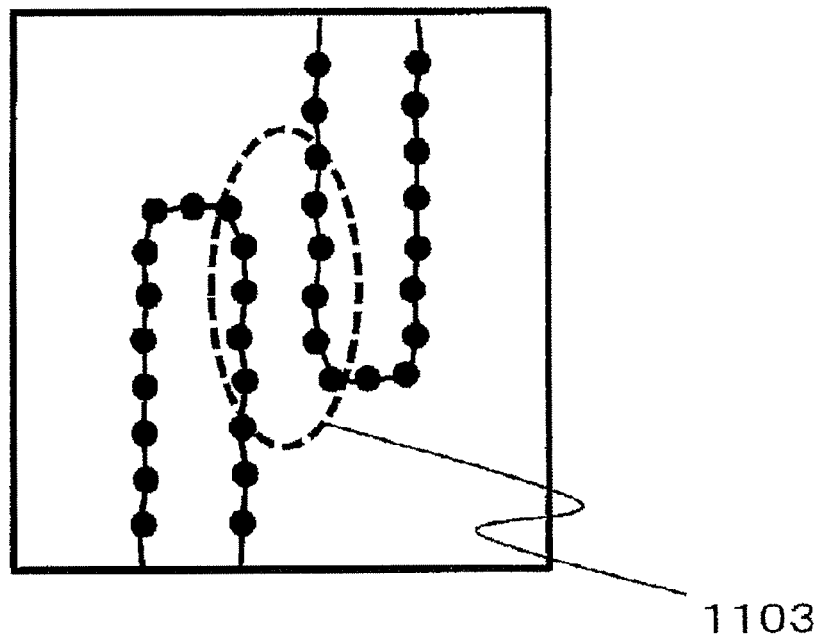
FIG. 11B is a schematic view of an outline before brightness decrease due to the steric hindrance is corrected.

FIG. 11A is a schematic view of a pattern structure in which brightness decrease occurs due to the steric hindrance and FIG. 11B is a schematic view of the outline before correction obtained in step S1002. In FIG. 11B, a place 1103 of a region indicated in a dotted line has many patterns in the vicinity thereof and a part of the signal electrons emitted from the surface of the sample collides with the pattern in the vicinity thereof and is not detected, and thereby the brightness is decreased. However, the decrease in the brightness due to the steric hindrance may be obtained by calculation if information of a stereoscopic shape of the pattern is known. The information of the stereoscopic shape is obtained from information of a pattern arrangement included in design data such as a CAD and information of the cross-section of the pattern that is obtained by calculation by lithography simulation or an observing method such as AFM, cross-section SEM, and cross-section TEM. Otherwise, as described below, the information of the outline extracted from the SEM image can be used instead of the information of the pattern arrangement by the design data. In the method, the information of the cross-sectional shape of the pattern stored in the pattern cross-section recording section 315 in advance and the pattern arrangement of the outline obtained in step S1002 are matched to obtain a stereoscopic shape, and a solid angle in which the signal electrons can escape in each position in the image without being shielded by the pattern in the vicinity thereof is calculated, and then the solid angle is made to be a signal detection rate. A signal detection rate d(i) is obtained in each point of the brightness profile in which the correction is performed. Furthermore, the signal detection rate is obtained in each point of the brightness profile similarly by assuming the pattern of the line shape illustrated in FIG. 1A and the signal detection rate is made to be a standard signal detection rate d0(i), and the decrease in the detection rate is calculated by the following Expression 6.

$$e(i)=d(i)/d_0(i) \quad \text{[Expression 6]}$$

Thereafter, the correction is performed with respect to the brightness profile P(i) and the brightness profile P'(i) after the correction is obtained as shown in the following Expression 7.

$$P'(i)=P(i)/e(i) \quad \text{[Expression 7]}$$

Figure 12:
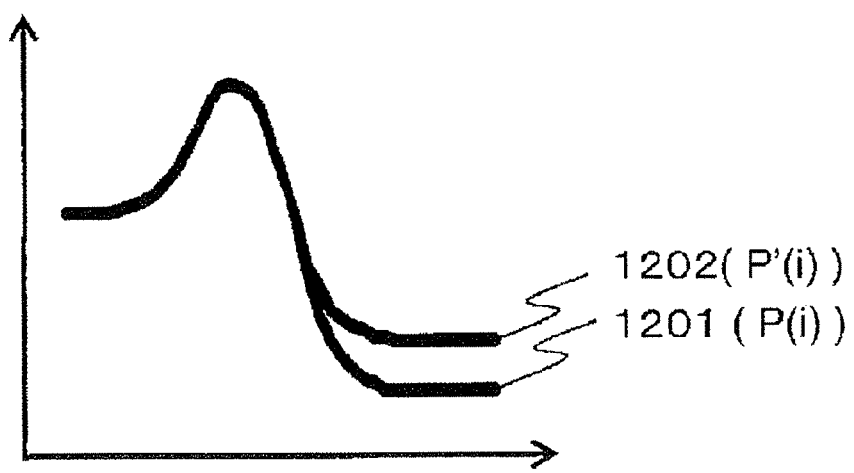
FIG. 12 is a view schematically illustrating brightness profiles before the correction and after the correction.

It is possible to correct the influence of the steric hindrance from the brightness profile by the method described above. FIG. 12 schematically illustrates the brightness profile before the correction 1201 and the brightness profile 1202 before the correction. Moreover, the information of the cross-sectional shape stored in the pattern cross-section recording section 315 may be input before the flowchart of FIG. 10 is performed or may use the shape that is stored in advance. Furthermore, if information of a detailed shape is not obtained, it may be determined by approximating a rectangular or trapezoidal shape by inputting only parameters such as a height (reference numeral 1101 of FIG. 11A) of the pattern or an inclined angle (reference numeral 1102 of FIG. 11A) of a side wall. Furthermore, in order to obtain the signal detection rate d(i) with high accuracy, angular dependence of an emission amount of the signal electrons may be considered. Generally, the emission amount of the signal electrons is known to be proportional to cos θ where an angle from the normal of the surface of the sample is θ and the signal detection rate may be obtained by adding a weight to each emission angle using the above description.

In step S1007, similar to step S607, the outline is configured of the edge point that is determined in step S1006 and the outline is stored in the outline recording section 312.

It is possible to correct the error of the edge point due to the brightness fluctuation caused by the steric hindrance and it is possible to obtain the outline having high accuracy by using the method described above when extracting the outline of the pattern from the SEM image.

Embodiment 4

Another embodiment according to the invention is a method in which a degree of the error of the outline due to the brightness fluctuation is calculated with respect to the SEM image in which the outline is extracted and the reliability of the SEM image is determined.

A schematic view of an entire configuration of an image processing device according to the embodiment is similar to FIG. 3.

Figure 13:
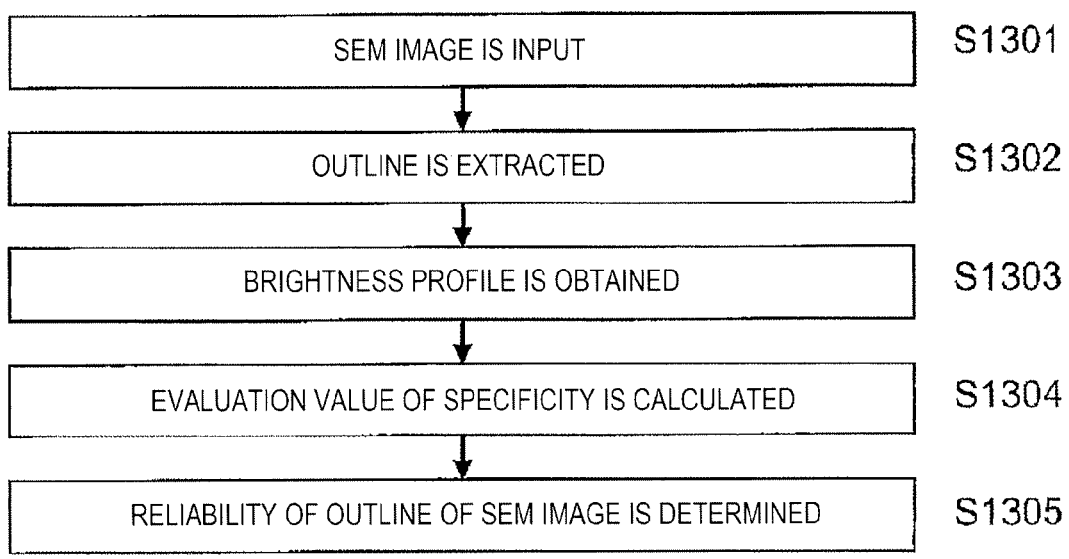
FIG. 13 is a view illustrating one example of a flowchart according to the embodiment.

FIG. 13 is one example of a flowchart according to the embodiment. Hereinafter, the flowchart is described.

A process from step S1301 to step S1304 is similar to the process from step S401 to step S404.

In step S1305, an average value of an evaluation value of the specificity is obtained with respect to all edge points in the SEM image and the average value is made to be a reliability index of the SEM image. Moreover, an after statistical index representing a plurality of values may be used in addition to the simple average value. If the reliability index of the SEM image is out of the range of the predetermined allowable value, it is determined that the reliability of the outline extracted from the SEM image is decreased. In this case, a warning indicating that there is a possibility of increase in the error of the outline may be displayed on a display device connected to the device. Thus, it is possible to promote re-obtaining of the SEM image or selection of the data by the user.

Embodiment 5

Another embodiment according to the invention is a SEM incorporating the image processing device illustrated in Embodiments 1 to 4.

The embodiment is described with reference to FIG. 14.

Figure 14:
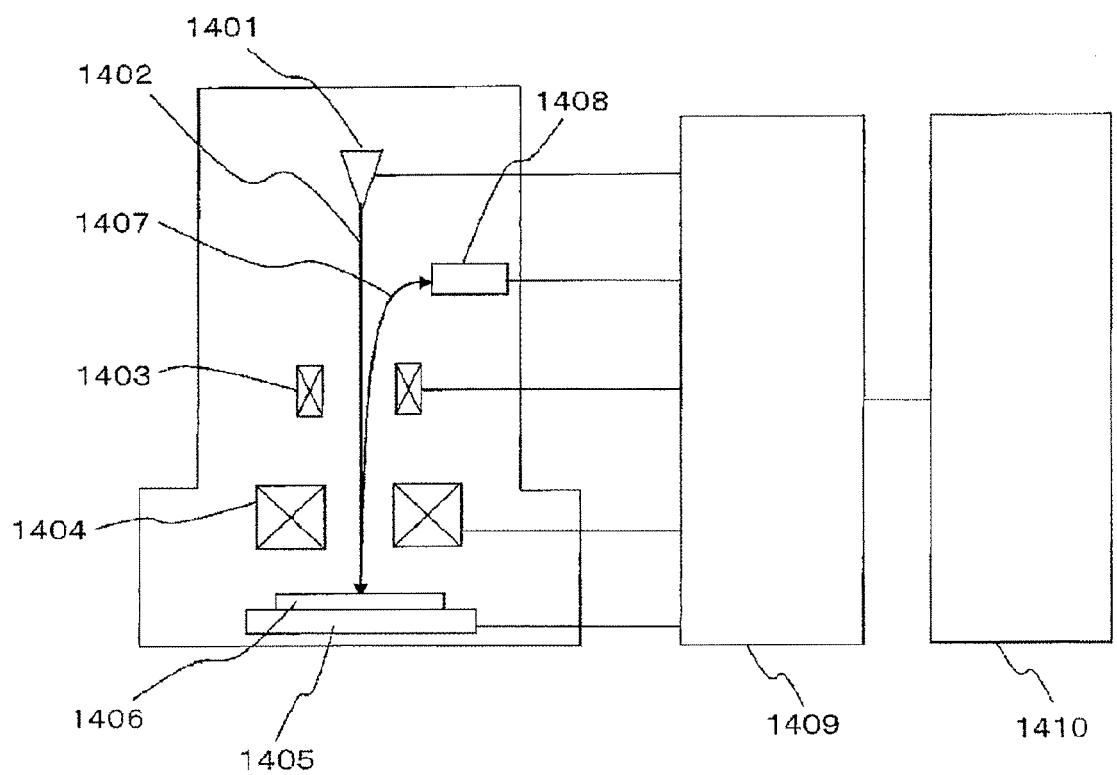
FIG. 14 is a view illustrating one example of a schematic outside view of an entire configuration of the SEM in the embodiment.

FIG. 14 is one example of a schematic outside view of an entire configuration of the SEM in the embodiment. An electron beam 1402 that is emitted by an electron source 1401 is deflected by a deflector 1403, is converged by an object lens 1404, and is irradiated on a surface of a sample 1406 that is held on a stage 1405. Secondary electron 1407 emitted from the surface of the sample by the irradiation of the electron beam is detected by a detector 1408. Those sections are controlled by a device control section 1409. The SEM image is generated by expressing signal intensity from the detector as the brightness of the pixel of a position corresponding to a deflection amount to the deflector on the image. The correction of the outline is performed by using an outline extracting calculation section 1410 with respect to the SEM image. The outline extracting calculation section 1410 is the image processing device illustrated in FIG. 3.

The error due to the brightness fluctuation when obtaining the SEM image is corrected and it is possible to obtain the outline line with high accuracy by applying the processes illustrated in Embodiments 1 to 4 to the image obtained by the SEM. Furthermore, it is possible to notify the user of whether or not obtaining conditions of the SEM image are suitable for the outline measurement by expressing the reliability of the edge point or the reliability of the outline in the obtained SEM image.

Embodiment 6

Another embodiment according to the invention is a SEM for realizing image obtaining conditions capable of obtaining the SEM image in which the reliability of the outline is increased. Since brightness fluctuation caused by the charging among the brightness fluctuations depends on obtaining conditions of the SEM image, it is possible to obtain the SEM image having high reliability by using appropriate image obtaining conditions.

The embodiment is described with reference to FIG. 15.

Figures 15, 16:
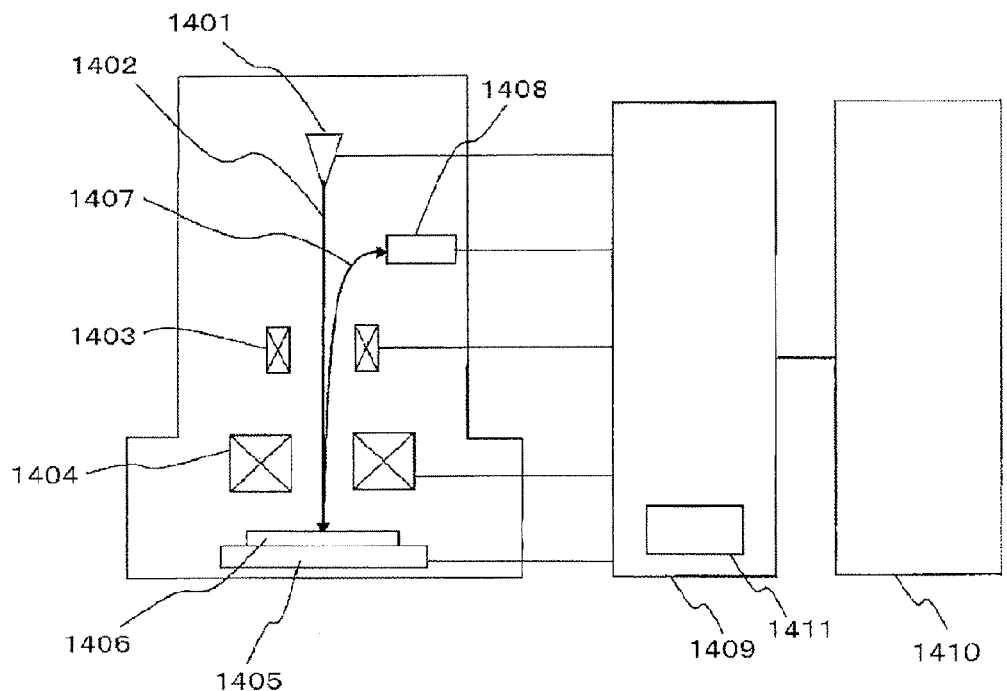
FIG. 15 is a view illustrating one example of a schematic outside view of an entire configuration of the SEM in the embodiment.
FIG. 16 is a view illustrating one example of accumulated data of a database in the embodiment.

FIG. 15 is one example of a schematic outside view of an entire configuration of the SEM in the embodiment and the example includes SEM image obtaining conditions and information of a material or a part thereof, and a database 1411 holding data of a relationship with the reliability index of the SEM image in addition to the configuration illustrated in FIG. 14. The SEM image obtaining conditions are an acceleration voltage value of the electron beam, a probe current value, a magnification, the number of integration of the frame, a scan speed, the order of the scan, and the like.

The SEM of the embodiment calculates the reliability index of the SEM image using the method of the Embodiment 4 when obtaining the SEM image and stores the SEM image obtaining conditions, the information of the material, and the reliability index at this time in the database 1411. Otherwise, data that is accumulated in another SEM may be stored. Thus, the data is accumulated in the database. FIG. 16 illustrates one example of the data.

When obtaining the SEM image having high reliability by using the database 1411, an input window illustrated in FIG. 17 is displayed on a display device not illustrated in FIG. 15, an article that is designated by the user and an article that is automatically set in the image obtaining conditions are selected by the user, and a designated value is input with reference to the article that is designated by the user. Furthermore, also it is selected as to whether the material of the pattern is unknown or is designated by the user, and if the material is designated, a name of the material is input. Next, the data including a value of the designated article in the data accumulated in the database 1411 is extracted, the article that is automatically set is determined by extracting the data having high reliability of the SEM image therein, and the image is obtained in the conditions. Otherwise, the article that is automatically set is displayed on the display device and it may be selected by the user to determine whether or not the image is obtained with the setting.

It is possible to decrease the brightness fluctuation caused by the charging and to obtain the SEM image having the outline with high accuracy by the method. Furthermore, the SEM image is obtained with respect to the same sample in a plurality of image obtaining conditions by using the SEM described in the embodiment and if the reliability indexes are greatly different when comparing the reliability indexes of the SEM images, it is possible to determine that the influence of the charging is great and to improve the reliability of the outline obtained from the SEM image.

As described above, it is possible to correct the measurement error of the edge point caused by the local fluctuation of the brightness of the SEM image with high accuracy and it is possible to obtain the outline or the dimensions of the pattern of the resist sample with high accuracy by using the invention.

REFERENCE SIGNS LIST

101 . . . line pattern, 102 . . . white band, 103 . . . region in the vicinity of white band, 201 . . . brightness profile, 202 . . . maximum value of brightness, 203 . . . minimum value of brightness, 204 . . . reference brightness, 205 . . . position that is reference brightness, 310 . . . recording device, 311 . . . image recording section, 312 . . . outline recording section, 313 . . . brightness profile recording section, 314 . . . evaluation value recording section, 315 . . . pattern cross-section recording section, 320 . . . calculation device, 321 . . . image processing calculation section, 322 . . . brightness profile evaluation calculation section, 323 . . . outline correction calculation section, 324 . . . steric hindrance calculation section, 1101 . . . height of pattern, 1102 . . . inclined angle of side wall, 1201 . . . brightness profile before correction, 1202 . . . brightness profile before correction, 1401 . . . electron source, 1402 . . . electron beam, 1403 . . . deflector, 1404 . . . object lens, 1405 . . . stage, 1406 . . . sample, 1407 . . . secondary electron, 1408 . . . detector, 1409 . . . device control section, 1410 . . . outline extracting calculation section, 1411 . . . database

The invention claimed is:

1. A measurement method for measuring an outline of a pattern from an image of a sample including the pattern obtained by a charged particle beam apparatus, comprising:
   a first step of extracting edge points configuring the outline of the pattern;
   a second step of obtaining a first brightness profile in the vicinity of a first edge point among the edge points;
   a third step of obtaining a second brightness profile in the vicinity of a second edge point among the edge points;
   a fourth step of obtaining a third brightness profile in the vicinity of a third edge point among the edge points;
   a fifth step of obtaining an evaluation value of a shape of the first brightness profile, based on the first brightness profile and the second and third brightness profiles that are obtained; and
   a sixth step of performing an outline correction of the pattern of the first edge point based on the evaluation value.

2. The measurement method according to claim 1, wherein the evaluation value in the shape of the first brightness profile is determined based on a difference between the maximum value of the first brightness profile and the maximum values of the second and third brightness profiles, a difference between the minimum value of the first brightness profile and the minimum values of the second and third brightness profiles, or a difference between the maximum value and the minimum value of the first brightness profile, and the maximum values and the minimum values of the second and third brightness profiles.

3. The measurement method according to claim 1, wherein the evaluation value in the shape of the first brightness profile is determined based on a difference between the maximum value of the first brightness profile and an average value of the maximum values of the second and third brightness profiles, a difference between the minimum value of the first brightness profile and an average value of the minimum values of the second and third brightness profiles, or a difference between the maximum value and the minimum value of the first brightness profile, and the average value of the maximum values and the average value of the minimum values of the second and third brightness profiles.

4. The measurement method according to claim 1, wherein the evaluation value in the shape of the first brightness profile is determined based on a difference between the maximum value of a first normalized profile obtained by normalizing the first brightness profile and the maximum values of second and third normalized profiles obtained by normalizing the second and third brightness profiles, a difference between the minimum value of the first normalized profile and the minimum values of the second and third normalized profiles, or a difference between the maximum value and the minimum value of the first normalized profile, and the maximum values and the minimum values of the second and third normalized profiles.

5. The measurement method according to claim 1,
wherein the evaluation value in the shape of the first brightness profile is determined based on a difference between the maximum value of a first normalized profile obtained by normalizing the first brightness profile and the maximum value of a fourth normalized profile obtained by averaging and normalizing the second and third brightness profiles, a difference between the minimum value of the first normalized profile and the minimum value of the fourth normalized profile, or a difference between the maximum value and the minimum value of the first normalized profile, and the maximum value and the minimum value of the fourth normalized profile.

6. The measurement method according to claim 1,
wherein the evaluation value in the shape of the first brightness profile is a normalization correlation coefficient between a profile obtained by normalizing the first brightness profile and profiles obtained by normalizing the second and third brightness profiles.

7. The measurement method according to claim 6,
wherein said normalization correlation coefficient, R, is determined according to $$R = \sum_{i=1}^{N} P_n(i)Q_n(i)$$

where N is a number of brightness data configuring the brightness profile, P0 and Q0 are respectively average brightnesses of P(i) and Q(i) determined according to $$P_0 = \frac{1}{N}\sum_{i=1}^{N} P(i), \qquad Q_0 = \frac{1}{N}\sum_{i=1}^{N} Q(i)$$

$$P_n(i) = \frac{P(i)-P_0}{\sqrt{\sum_{i=1}^{N}(P(i)-P_0)^2}}, \quad Q_n(i) = \frac{Q(i)-Q_0}{\sqrt{\sum_{i=1}^{N}(Q(i)-Q_0)^2}}$$

and Pn(i) and Qn(i) are functions obtained by normalizing P(i) and Q(i), respectively.

8. The measurement method according to claim 1,
wherein the evaluation value in the shape of the first brightness profile is obtained by linearly approximating the brightness profile obtained by taking a difference between a profile obtained by normalizing the first brightness profile and profiles obtained by normalizing the second and third brightness profiles.

9. The measurement method according to claim 1,
wherein the outline correction based on the evaluation value is a correction reconfiguring the outline except the first edge point from the edge points configuring the outline if the evaluation value is not in a predetermined value.

10. The measurement method according to claim 1,
wherein the outline correction based on the evaluation value re-extracts positions of the edge points by correcting reference brightness when determining the position of the first edge point based on the evaluation value and reconfigures the outline based on the re-extracted edge points if the evaluation value is not in a predetermined range.

11. The measurement method according to claim 10,
wherein said correcting reference brightness is performed using a corrected reference brightness, C', determined according to one of:

$$C'=(B-M_1)+[A-(B-M_1)]*T;$$

$$C'=B+[(A-M_2)-B]*T; \text{ and}$$

$$C'=(B-M_1)+[(A-M_2)-(B-M_1)]*T$$

where
A is a maximum value of a brightness inside a brightness profile and B is a minimum value of a brightness that is outside of the pattern more than a position of a peak of the maximum value B, and T is a value of a range from 0 to 1, and
M1 and M2 are differences between minimum values of normalized profiles obtained by subtracting a minimum value of a first normalized average brightness profile from a minimum value of a second normalized brightness profile.

12. The measurement method according to claim 1,
wherein the outline correction based on the evaluation value
calculates a detection decreasing rate, e(i), of signal electrons in the first brightness profile, P(i), based on information of the outline and a cross-sectional shape of the pattern if the evaluation value is not in a predetermined range,
performs the correction of the first brightness profile P(i) based on the detection decreasing rate e(i), and
re-extracts the position of the first edge point by a corrected first brightness profile, P'(i), and reconfigures the outline by the re-extracted edge point, and
where P'(i)=P(i)/e(i) and e(i)=d(i)/d$_0$(i),
in which d(i) is a signal detection rate for each edge point of the first brightness profile and d$_0$(i) is a standard signal detection rate.

13. The measurement method according to claim 1,
wherein the outline correction based on the evaluation value replaces the first brightness profile with a profile obtained by averaging the second and third brightness profiles and re-extracts positions of the first edge points by a replaced profile, and reconfigures the outline by re-extracted edge points.

14. The measurement method according to claim 1, further comprising:
a seventh step of obtaining an average value or a representative value of a plurality of edge points in the image and calculating a reliability of the edge points or the outline.

15. An image processing device that measures an outline of a pattern from an image of a sample including the pattern obtained by a charged particle beam apparatus, comprising:
a brightness profile obtaining section that obtains a plurality of brightness profiles in the vicinity of edge points configuring the outline;
a shape evaluation section that extracts an evaluation value of a shape of a first brightness profile, based on the plurality of brightness profiles; and
an outline correction section that corrects the outline of the edge points of the first brightness profile, based on the evaluation value.

16. The image processing device according to claim 15, further comprising:
an evaluation display section that displays the evaluation value and positions of the edge points of the first brightness profile.

17. The image processing device according to claim 16, further comprising:
   a whether or not input section that inputs whether or not the correction of the edge points of the first brightness profile can be performed.

18. A charged particle beam apparatus comprising:
   the image processing device according to claim 15.

19. The charged particle beam apparatus according to claim 18, further comprising:
   a reliability calculation section that calculates a reliability of the edge points or the outline, based on the evaluation value.

20. The charged particle beam apparatus according to claim 18, further comprising:
   a database section that stores a reliability of the edge points or the outline and conditions in which an image of the sample is obtained.

* * * * *